(12) United States Patent
Jaquette et al.

(10) Patent No.: US 7,376,888 B2
(45) Date of Patent: May 20, 2008

(54) INTERLEAVED RECORDING OF SEPARATED ERROR CORRECTION ENCODED INFORMATION

(75) Inventors: Glen Alan Jaquette, Tucson, AZ (US); Johnny Lynn Teale, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 626 days.

(21) Appl. No.: 10/969,652

(22) Filed: Oct. 19, 2004

(65) Prior Publication Data

US 2006/0085718 A1    Apr. 20, 2006

(51) Int. Cl.
*H03M 13/00* (2006.01)
*G11C 29/00* (2006.01)

(52) U.S. Cl. ........................ 714/771; 714/702
(58) Field of Classification Search .............. 714/755, 714/752, 771, 702
See application file for complete search history.

(56) References Cited

U.S. PATENT DOCUMENTS

| | | | |
|---|---|---|---|
| 4,539,605 A | 9/1985 | Hoshino et al. | 360/32 |
| 5,283,791 A | 2/1994 | Halford | 714/766 |
| 5,412,671 A | 5/1995 | Tsuchiya | 714/805 |
| 5,602,685 A | 2/1997 | Lee | 386/47 |
| 5,778,139 A * | 7/1998 | Kim | 386/81 |
| 6,029,186 A | 2/2000 | DesJardins et al. | 708/492 |
| 6,334,024 B1 | 12/2001 | Ohishi et al. | 386/95 |
| 6,369,982 B2 * | 4/2002 | Saliba | 360/122 |
| 6,438,727 B2 | 8/2002 | Kim | 714/764 |
| 6,631,485 B1 | 10/2003 | Morley et al. | 714/701 |

FOREIGN PATENT DOCUMENTS

| | | |
|---|---|---|
| EP | 395125 A2 | 10/1990 |
| EP | 397472 A2 | 11/1990 |
| EP | 817481 A2 | 1/1998 |

OTHER PUBLICATIONS

"Two-Dimensional Interleaving ECC for Mixed Error Modes", IBM Technical Disclosure Bulletin, vol. 18, No. 8, Jan. 1976, pp. 2631-2632.
"Error Correction code Pointer Control with Pointer Preprocessing", IBM Technical Disclosure Bulletin, vol. 39, No. 07, Jul. 1996, pp. 101-104.

* cited by examiner

*Primary Examiner*—Shelly Chase
(74) *Attorney, Agent, or Firm*—John H. Holcombe

(57) ABSTRACT

An error correction code system, e.g. of a magnetic tape drive, applies error correction redundancy to data, separates it, or interleaves it, and records it into separate groups. An error correction encoder applies an outer error correction code to one of the separate groups of information, forming one set of rows of information and outer ECC information. An error correction encoder applies an outer error correction code to another separate group of information, forming another set of rows of information and outer ECC information. A data organizer interleaves the one set of rows of information and outer ECC information with the another set of rows of information and outer ECC information for recording on tracks of a recording media in an interleaved pattern of one set of rows of information and outer ECC information with another set of rows of information and outer ECC information.

6 Claims, 2 Drawing Sheets

INTERLEAVED RECORDING OF SEPARATED ERROR CORRECTION ENCODED INFORMATION

FIELD OF THE INVENTION

This invention relates to recording of information with respect to recording media, and, more particularly, to recording error correction encoded information.

BACKGROUND OF THE INVENTION

Information recorded with respect to recording media is typically employed as a means of preserving that information. Error correction encoding of that information allows the information to be recorded and preserved despite the presence of certain types of errors in the recorded information. Various approaches have evolved regarding the types of error correction encoding to apply to the information. A typical approach is to use a true cross-product error correction code. For example, the information is arranged in a two-dimensional array with rows and columns, and two error correction codes (ECC) are applied to the matrix. One ECC (C1) is applied along the rows, and another ECC (C2) is applied along the columns. If the ECC codes are systematic ECC codes, then the data bytes in the original array are not altered; rather, some number of error correction bytes are appended, forming redundancy of information so that some number of errors might be corrected. For example, a C1 code might append a given number of error correction bytes to each row, and a C2 code might append a given number of error correction bytes to each column. The data bytes together with the appended error correction bytes form an error correction codeword. As an example, a C1 codeword is the data bytes in a row plus the appended C1 error correction bytes. Similarly, a C2 codeword is the data bytes in a column plus the appended C2 error correction bytes.

One of the ECC codes, e.g. C1, might be called the inner code, and the other ECC code, e.g. C2, the outer code. The outer code may encode not only the data bytes, but also the appended error correction bytes of the inner code, and may encode a plurality of C1 codewords. The code names have to do with the typical order of decoding. The inner code is typically decoded first, and the outer code is typically decoded next, though they could be appended in opposite order.

The inner and outer codes might be primarily designed to handle different error mechanisms. As an example, if complete C1 inner codewords are recorded to a given tape track, correction with the C1 code could allow correction of a small error events due to media imperfections or noise. But a long or burst error along a given tape track, e.g. due to a scratch in the direction of the tape's length (longitudinally), may exceed the ability of C1 to correct it. For this reason, C2 ECC codewords might be spread laterally in a pattern across different tracks so that data from one track which cannot be corrected with C1 may be corrected instead by using data from other tracks, or data which is distributed relatively far away along the same track for C2. For example, if a tape is recorded 8 tracks at a time, and if the C2 outer code consists of 64 bytes, then ⅛ of the data in each C2 codeword is typically recorded to each of the 8 simultaneous tracks, and each track must typically contain 8 of the bytes of that codeword. But, the 8 bytes along a given track may be spread apart longitudinally, so that a scratch or burst error of limited length would be unlikely to cause more than one of the bytes in a given track to be read in error. For example, the 8 bytes from a given C2 codeword might be spread multiple C1 codewords apart along a track which could be a thousand or more bytes apart.

Herein, an inner correction code applied to a row of the matrix, and the resultant inner correction codewords, are called "inner code"; and the outer correction code, and the resultant outer correction codewords, are called "outer ECC information".

The data rate of recording to and reading from a recording media is dependent on a number of factors, and one factor is the number of tracks that are recorded or read at the same time. Thus, it may be desirable to increase the amount of information and the number of tracks that are recorded or read at the same time. However, in doing so, it is also desirable to increase the power of the outer correction code to cope with the increased amount of information and to continue to allow recreation of the data. For example, doubling the amount of information per track and recording that amount of information on double the number of tracks that are recorded or read at the same time, may result in having to increase the amount of inner code and of outer ECC information at least proportionally, so that at least four times as many total ECC bytes are recorded.

SUMMARY OF THE INVENTION

The present invention comprises an error correction code system, a magnetic tape drive, and a data storage tape.

In various embodiments, an error correction code system comprises an error correction encoder for applying an outer error correction code to one of separate groups of information, forming one set of rows of information and outer ECC information, the rows for recording on tracks of a recording media; an error correction encoder for applying an outer error correction code to another of the separate groups of information, forming another set of rows of information and outer ECC information, the rows for recording on tracks of a recording media; and a data organizer for interleaving the one set of rows of information and outer ECC information with the another set of rows of information and outer ECC information for recording on tracks of a recording media in an interleaved pattern of one set of rows of information and outer ECC information with another set of rows of information and outer ECC information.

In one embodiment, the error correction encoder comprises a multiplexed error correction encoder.

In another embodiment, the error correction encoder comprises a first separate error correction encoder for applying an outer error correction code to the one of the separate groups of information, and a second separate error correction encoder for applying an outer error correction code to another of the separate groups of information.

In a further embodiment, the separate groups of information comprise two separate groups of information; and the data organizer interleaves the one set of rows of information and outer ECC information with the another set of rows of information and outer ECC information for recording on tracks of a recording media in an odd and even interleaved pattern of one set of rows of information and outer ECC information with another set of rows of information and outer ECC information. In a still further embodiment, the first error correction encoder and the second error correction encoder each form an equal number of rows of information and outer ECC information, respectively for the one set of rows of information and outer ECC information and for the another set of rows of information and outer ECC information; and the data organizer interleaves the one set of rows of information and outer ECC information with the another set of rows of information and outer ECC information for recording an equal number of the tracks of a recording media in the odd and the even interleaved pattern of one set of rows of information and outer ECC information and another set of rows of information and outer ECC information.

In a further embodiment, a magnetic tape drive comprises a tape drive system for moving a magnetic tape longitudinally; a recording system for recording supplied information to a magnetic tape, the magnetic tape recording system having at least one magnetic tape recording head for recording a plurality of parallel tracks of the information with respect to the magnetic tape as the magnetic tape is moved longitudinally by the tape drive system; and a data handling system for supplying information for recording by the recording system. The data handling system comprises a data separator for arranging the supplied information into separate groups; an error correction encoder for applying an outer error correction code to one of the separate groups of information, forming one set of rows of information and outer ECC information; an error correction encoder for applying an outer error correction code to another of the separate groups of information, forming another set of rows of information and outer ECC information; and a data organizer for interleaving the one set of rows of information and outer ECC information with the another set of rows of information and outer ECC information, and supplying the rows of information and outer ECC information to the recording system for recording on the parallel tracks of a magnetic tape by the recording system in an interleaved pattern of one set of rows of information and outer ECC information with another set of rows of information and outer ECC information.

In a further embodiment, the data separator arranges the information into two separate groups; and the data organizer interleaves the one set of rows of information and outer ECC information with the another set of rows of information and outer ECC information for recording on the parallel tracks of a magnetic tape in an odd and even interleaved pattern of one set of rows of information and outer ECC information with another set of rows of information and outer ECC information. In a still further embodiment, the first error correction encoder and the second error correction encoder each form an equal number of rows of information and outer ECC information, respectively for the one set of rows of information and outer ECC information and for the another set of rows of information and outer ECC information; and the data organizer interleaves the one set of rows of information and outer ECC information with the another set of rows of information and outer ECC information for recording on the parallel tracks of a magnetic tape in the odd and the even interleaved pattern of one set of rows of information and outer ECC information and another set of rows of information and outer ECC information.

In still another embodiment, a data storage tape comprises a longitudinal recording medium; and a plurality of parallel tracks of recorded information, comprising an interleaved pattern of one set of rows of information and outer ECC information, and at least another set of rows of information and outer ECC information; the rows of information and outer ECC information comprising information from separate groups of information and separate applied outer error correction codes; the one set of rows of information and outer ECC information formed from one of the separate groups of information and an applied outer error correction code, and the at least another set of rows of information and outer ECC information formed from at least another of the separate groups of information and an applied outer error correction code.

In a further embodiment, the plurality of parallel tracks of recorded information comprises two separate groups of information interleaved in an odd and even interleaved pattern of the one set of rows of information and outer ECC information with the another set of rows of information and outer ECC information. In a still further embodiment, the plurality of parallel tracks of recorded information comprises an equal number of the parallel tracks of recorded information in the odd and the even interleaved pattern of one set of rows of information and outer ECC information and another set of rows of information and outer ECC information.

For a fuller understanding of the present invention, reference should be made to the following detailed description taken in conjunction with the accompanying drawings.

DETAILED DESCRIPTION OF THE INVENTION

This invention is described in preferred embodiments in the following description with reference to the FIGURES, in which like numbers represent the same or similar elements. While this invention is described in terms of the best mode for achieving this invention's objectives, it will be appreciated by those skilled in the art that variations may be accomplished in view of these teachings without deviating from the spirit or scope of the invention.

Figure 1:
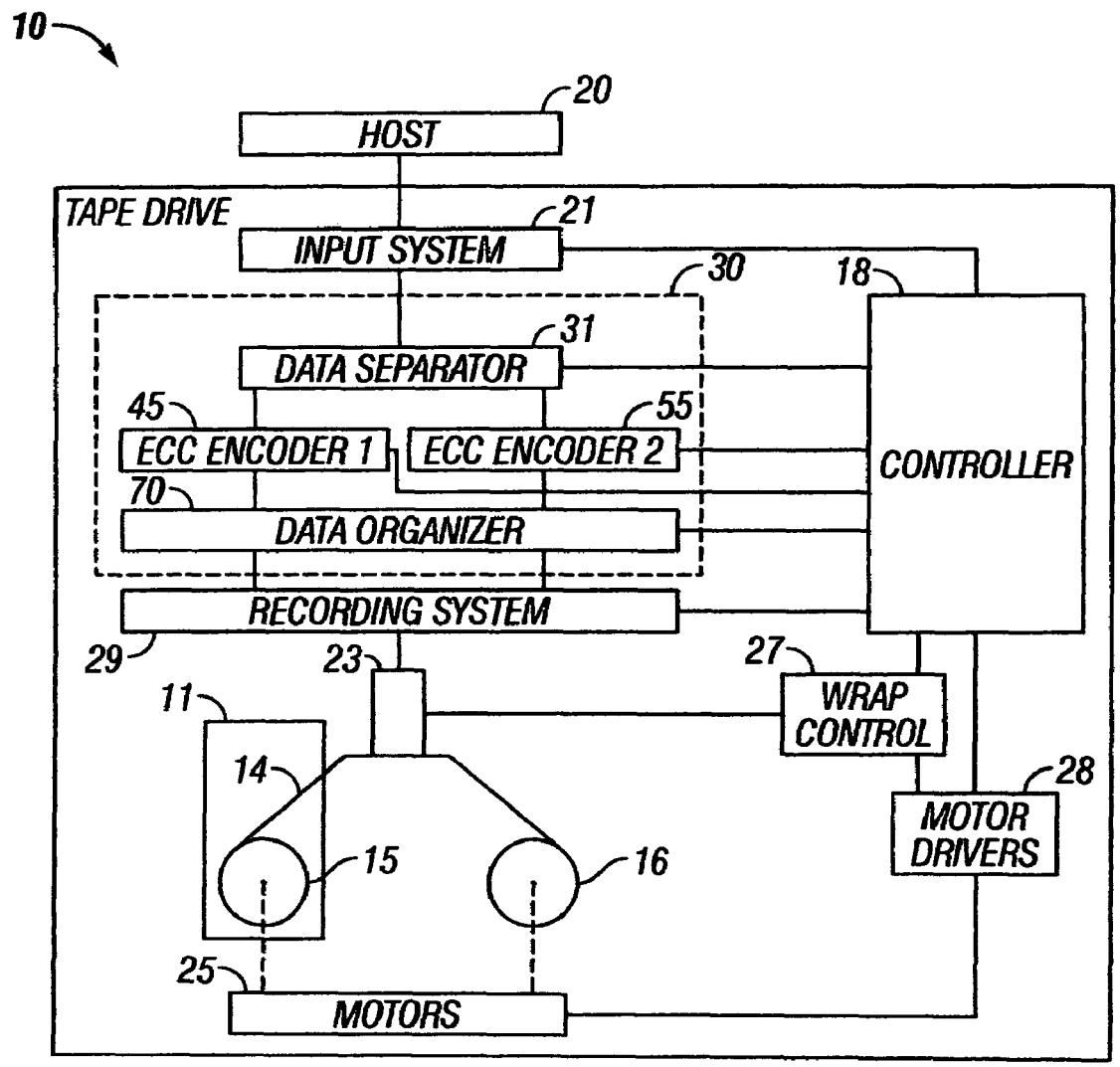
FIG. 1 is a block diagram of an embodiment of a tape drive with a magnetic tape cartridge, which tape drive implements the present invention.

Referring to FIG. 1, a tape drive 10 is illustrated which may implement the present invention. The tape drive provides a means for reading and writing information with respect to a magnetic tape cartridge 11. A cartridge and associated tape drive are illustrated, such as those adhering to the Linear Tape Open (LTO) format. An example of a single reel tape drive is the IBM 3580 Ultrium magnetic tape drive based on LTO technology. A further example of a single reel tape drive and cartridge is such as that discussed in U.S. Pat. No. 5,432,652, Comeaux et al., issued Jul. 11, 1995. Another example of a single reel tape drive is the IBM 3590 Magstar magnetic tape drive and associated magnetic tape cartridge. An example of a dual reel cartridge is the IBM 3570 magnetic tape cartridge and associated drive.

As is understood by those of skill in the art, a magnetic tape cartridge 11 comprises a length of magnetic tape 14 wound on one or two reels 15, 16. Also as is understood by those of skill in the art, a tape drive 10 comprises one or more controllers 18 for operating the tape drive in accordance with commands received from a host system 20 received at an input system 21. The tape drive may comprise a standalone unit or comprise a part of a tape library or other subsystem. The tape drive 10 may be coupled to the host system 20 directly, through a library, or over a network, and employ the Small Computer Systems Interface (SCSI), Fibre Channel Interface, etc. The information to be recorded may also be supplied from the host system 20 and received at the input system 21.

The magnetic tape cartridge 11 may be inserted in the tape drive 10, and loaded by the tape drive so that one or more tape heads 23 reads and/or writes information with respect to the magnetic tape 14 as the tape is moved longitudinally by one or more motors 25. The magnetic tape comprises a plurality of parallel tracks, or groups of tracks. In some formats, such as the LTO format, above, the tracks are arranged in a serpentine back and forth pattern of separate wraps, as is known to those of skill in the art. Also as known to those of skill in the art, a wrap control system 27 electronically switches to another set of read and/or write heads, and/or seeks and moves the read and/or write heads 23 laterally of the magnetic tape, to position the heads at a desired wrap or wraps, and, in some embodiments, track follows the desired wrap or wraps. The wrap control system may also control the operation of the motors 25 through motor drivers 28, both in response to instructions by the controller 18.

Controller 18 also provides the data flow and formatting of data to be read from and written to the magnetic tape, as is known to those of skill in the art. Data is physically recorded by a recording system 29, which may comprise recording channels associated with one or more of the read and/or write heads 23, as is known to those of skill in the art, and may comprise a read after write capability. The magnetic tape drive 10 thus records data on parallel tracks of the magnetic tape 14. Other parallel drives for recording on recording media are also known to those of skill in the art, such as parallel track helical magnetic tape drives, and parallel track optical tape drives.

The controller 18 may comprise logic, programmable logic, or may comprise at least one programmable computer processor operating under the control of program code.

In accordance with the present invention, a data handling system 30 supplies information for recording by the recording system 29. The data handling system 30 may comprise separate logic or separate programmable logic, or partially separate logic or separate programmable logic, or may be implemented wholly or partially by the controller 18.

Figure 2:
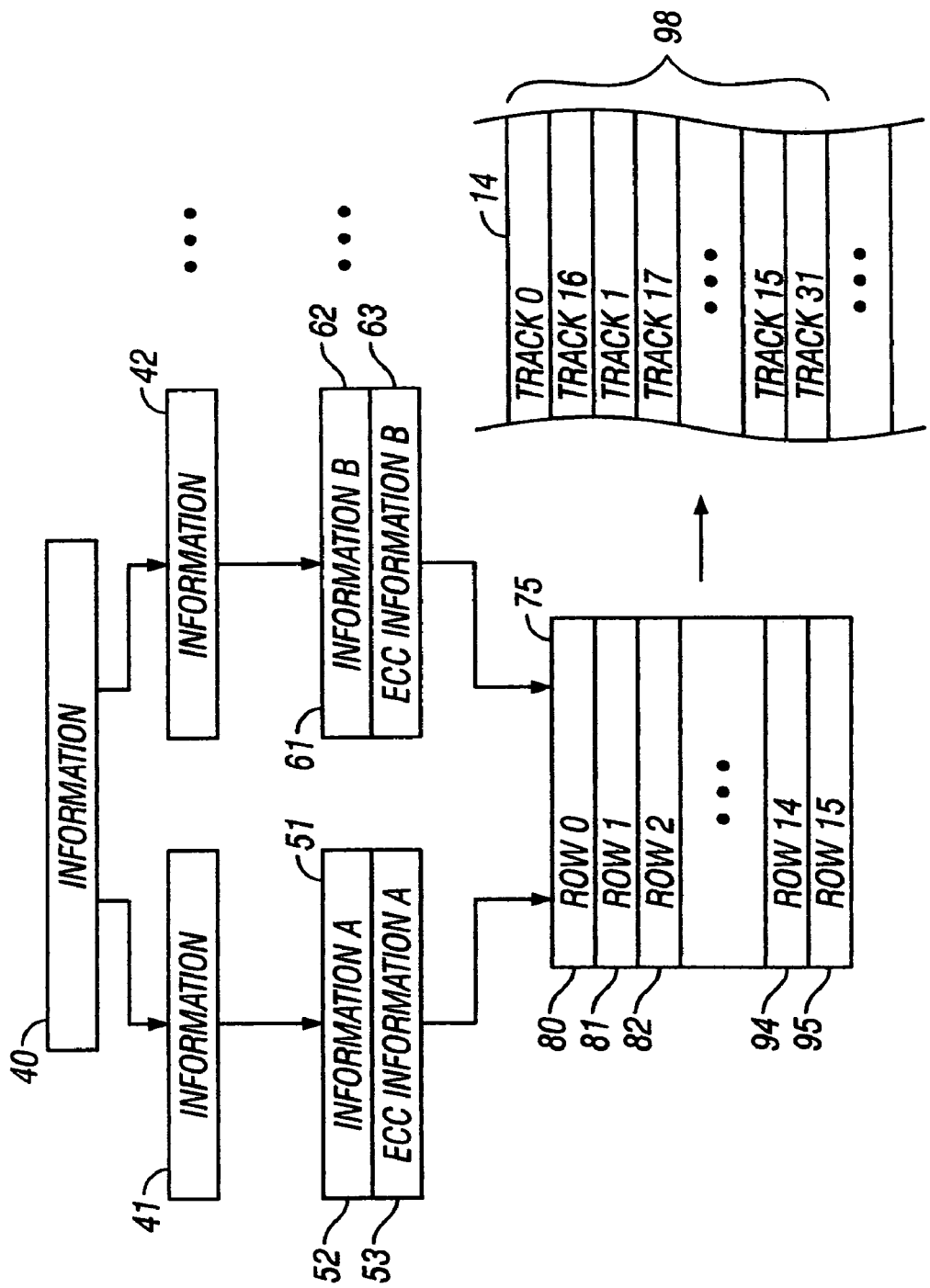
FIG. 2 is a diagrammatic illustration of information and of outer ECC information as processed in accordance with the present invention by the tape drive of FIG. 1.

Referring additionally to FIG. 2, the data handling system 30 comprises a data separator 31 for arranging the supplied information 40 into separate groups 41, 42, etc. As one example, information 40 may be initially protected by a CRC (cyclic redundancy check) character and separated into separate groups; may be arranged into a form which will provide the information for a data set or sub data sets, and separated into separate groups and the information compressed and formatted after separation, or may comprise completed data sets or sub data sets that are separated into separate groups 41, 42, etc. The inner error correction algorithm, if any, may be applied before or after separation.

Referring to FIGS. 1 and 2, an error correction encoder 45, 55 is illustrated. The error correction encoder may comprise a single encoder operated in time slice multiplexing mode. Alternatively, the error correction encoder may comprise multiple encoders. Herein, one multiplexing use of a single encoder or one separate encoder is called a "first error correction encoder 45", and another multiplexing use of a single encoder or another separate encoder is called a "second error correction encoder 55".

A first error correction encoder 45 applies an outer error correction code to one of the separate groups of information, e.g. separate group 41 forming one set 51 of rows of information 52 and outer ECC information 53. The outer error correction code may comprise any suitable outer error correction algorithm and is applied to the separate group of information in any suitable form, such as compressed and formatted information, and generates outer ECC information 53. For example, the correction algorithm may treat the data as though it were in a logical matrix of information, perhaps logically in blocks of information that appear to be in a pattern across the matrix rather than in sequence. The outer correction code may thus be applied to the columns of the matrix, or to rows of the matrix, in a manner similar to that of the C2 outer error correction code discussed above. The outer correction code may be at least sufficiently powerful to allow recreation of any one lost, damaged, or unreadable track, as will be discussed. The generated outer ECC information 53 may comprise any suitable form, such as code words, as is known to those of skill in the art.

The first error correction encoder 45 forms a set 51 of rows of information 52 and outer ECC information 53, such that the outer ECC information 53 is located as desired. The rows of information 52 may correspond to individual tracks to be recorded, and may be intermixed with respect to those tracks. Thus, a set of rows of information 52 corresponds to a number of rows equal to 1/n of the total number of tracks of the recording media that are to be recorded in parallel by the recording system in the pass encompassing the separated groups of information, where "n" represents the number of separate groups of information from an ECC point of view. For example, the total number of tracks of a recording medium may comprise "x" tracks, only "y" of which are to be recorded at once in the pass. Thus, the number of rows for a set of rows of information 52 comprises y/n. In the example of a magnetic tape head 23 of, e.g. 16 tracks, where two separate groups of information are to be recorded, y/n equals 8 tracks, and therefore 8 rows of information are in the separate group 51. The outer correction code may be at least sufficiently powerful to allow recreation of any of the rows of information, representing one track that may be lost, damaged, or unreadable.

The ECC information may be supplied with the rows of information in any suitable form. In one example, the ECC information 53 is appended at the end of the rows of information 52 of the set 51 of rows of information 52 and outer ECC information 53, or, in another example, is arranged in a pattern across the various rows of information 52.

Referring to FIGS. 1 and 2, at least a second error correction encoder 55 is provided for applying an outer error correction code to another of the separate groups of information 41, 42, etc. As many second error correction encoders are provided as separate groups of information are provided by the data separator 31, less the one separate group of information processed by the first error correction encoder 45.

The second error correction encoder(s) 55 may be identical to the first error correction encoder 45, or may have any suitable differences, such as different algorithms, for example, if the amount of information is different on a consistent basis between the separate groups of information.

The second error correction encoder(s) 55 each forms another set 61 of rows of information 62 and outer ECC information 63. As above, the outer error correction code may comprise any suitable outer error correction algorithm and is applied to the separate group of information in any suitable form, such as compressed and formatted information, and generates outer ECC information 63. For example, the correction algorithm may treat the data as though it were in a logical matrix of information, perhaps logically in blocks of information that appear to be in a pattern across the matrix rather than in sequence. The outer correction code may thus be applied to the columns of the matrix, or to rows of the matrix, as discussed above. The outer correction code may also be at least sufficiently powerful to allow recreation of any one lost, damaged, or unreadable track. The generated outer ECC information 63 may comprise any suitable form, such as code words in the form of pairs or quads, as is known to those of skill in the art.

The second error correction encoder(s) 55 each form a set 61 of rows of information 62 and outer ECC information 63, such that the outer ECC information 63 is located as desired. The rows of information 62 correspond to individual tracks to be recorded, and do not necessarily correspond to any row or rows of a matrix. Thus, a set of rows of information 62 also corresponds to a number of rows equal to 1/n of the total number of tracks of the recording media that are to be recorded in parallel by the recording system in the pass encompassing the separated groups of information, where "n" represents the number of separate groups of information from an ECC point of view. Using the same example, a recording medium may comprise a total number of "x" tracks, only "y" of which are to be recorded simultaneously in the pass. Thus, the number of rows for a set of rows of information 62 comprises y/n. In the example of a magnetic tape head 23 of, e.g. 16 tracks, where two separate groups of information are to be recorded, y/n equals 8 tracks, and therefore 8 rows of information are in the separate group 61. The outer correction code may be at least sufficiently powerful to allow recreation of any of the rows of information, representing one track that may be lost, damaged, or unreadable.

The ECC information may be supplied with the rows of information in any suitable form. In one example, the ECC information 63 is appended at the end of the rows of information 62 of the set 61 of rows of information 62 and outer ECC information 63, or, in another example, is arranged in a pattern across the various rows of information 62.

Referring to FIGS. 1 and 2, a data organizer 70 interleaves the one set 51 of rows of information and outer ECC information with the another set(s) 61 of rows of information and outer ECC information as illustrated by rows 75, and supplies the rows of information and outer ECC information to the recording system 29 for recording on the parallel tracks of the recording medium, such as a magnetic tape 14, by the recording system 29 in an interleaved pattern of one set of rows of information and outer ECC information with another set(s) of rows of information and outer ECC information.

In one example, the data organizer 70 interleaves one set of rows of information and outer ECC information with another set of rows of information and outer ECC information in reverse sequence. Thus, in FIG. 2, one row of information and outer ECC information from the one set 51 of rows of information and outer ECC information is provided at row 80, and the next row provided at row 82; and one row of information and outer ECC information from the another set 61 of rows of information and outer ECC information is provided at row 95, and each added row is provided at an interleaved row of lower number, culminating with the last of the rows from the another set 61 provided at row 81.

In another example, the data organizer interleaves one set of rows of information and outer ECC information with another set of rows of information and outer ECC information in the same sequential direction. Thus, in FIG. 2, one row of information and outer ECC information from the one set 51 of rows of information and outer ECC information is provided at row 80, and each added row is provided at an interleaved row of a higher number. One row of information and outer ECC information from an another set 61 of rows of information and outer ECC information is provided at row 81, and each added row is provided at an interleaved row of a higher number. Rows from further another sets of rows of information and outer ECC information are provided in adjacent rows, for example, beginning at row 82 and culminating with the last of the rows from the further another set provided at row 94. Thus, all of the rows of information and outer ECC information are arranged in the same direction.

In a further embodiment, the data separator 31 of FIG. 1 arranges the information into two separate groups; and the data organizer 70 interleaves the one set of rows of information and outer ECC information with the another set of rows of information and outer ECC information for recording on the parallel tracks of a magnetic tape in an odd and even interleaved pattern of one set of rows of information and outer ECC information with another set of rows of information and outer ECC information. In FIG. 2, the rows from the one set 51 of rows of information and outer ECC information form even numbered rows 80, 82, etc., and the rows from the another set 61 of rows of information and outer ECC information form odd numbered rows 81, etc. If the amount of information is not equal in the sets 51 and 61, the total number of rows of each may not be equal, and may be filled in with null characters.

Referring to FIGS. 1 and 2, in a still further embodiment, the first error correction encoder 45 and the second error correction encoder 55 each form an equal number of rows of information and outer ECC information, respectively for the one set 51 of rows of information and outer ECC information and for the another set 61 of rows of information and outer ECC information; and the data organizer 70 interleaves the one set of rows of information and outer ECC information with the another set of rows of information and outer ECC information for recording in the above odd and the even interleaved pattern of one set of rows of information and outer ECC information and another set of rows of information and outer ECC information.

The interleaved rows 75 of information and outer ECC information of the desired interleaved pattern are supplied to the recording system 29 for recording on the parallel tracks 98 of the recording medium, for example, magnetic tape 14, by the recording system in an interleaved pattern of one set of rows of information and outer ECC information with at least another set of rows of information and outer ECC information. For example, the magnetic tape 14 comprises a plurality of parallel tracks 98 that are arranged in groups of tracks, and the interleaved rows 75 of information and outer ECC information are recorded by the recording system in one group of those tracks. In the example of a magnetic tape head 23 of, e.g. 16 tracks, rows numbered 0-15 are recorded at tracks 16-31. In another pass, new rows numbered 0-15 are recorded at a different group of tracks, such as tracks 0-15. The rows may be arranged in the same or inverse directions, or may be scattered, while maintained in the odd and even interleaved pattern. In some formats, such as the LTO format, above, a group of tracks is called a wrap, as is known to those of skill in the art. Also as known to those of skill in the art, the various groups of tracks are accessed by a wrap control system 27 which electronically switches to another set of read and/or write heads, and/or seeks and moves the read and/or write heads 23 laterally of the magnetic tape, to position the heads at a desired wrap, and, in some embodiments, track follows the desired wrap.

The longitudinal positioning of the information and outer ECC information along a track may be adjusted, for example, based on the detection of errors in a read after write process.

Thus, the resultant data storage tape, such as magnetic tape 14, comprises a plurality of parallel tracks (one set out of the total number of tracks 98) of recorded information comprising an interleaved pattern of one set of rows of information and outer ECC information, and at least another set of rows of information and outer ECC information, formed from separate groups as discussed above.

The illustrated components of the magnetic tape drive of FIG. 1 may be varied, combined, or combined functions may be separated, as is known to those of skill in the art. The components of an alternative parallel drive for recording on recording media in the form of parallel tracks are similar to those of the magnetic tape drive, designed instead for the characteristics of the recording media.

While the preferred embodiments of the present invention have been illustrated in detail, it should be apparent that modifications and adaptations to those embodiments may occur to one skilled in the art without departing from the scope of the present invention as set forth in the following claims.

What is claimed is:

1. An error correction code system, comprising;
   an error correction encoder for applying an outer error correction code to one of separate groups of information, forming one set of rows of information and outer ECC information, said rows for recording on tracks of a recording media;
   an error correction encoder for applying an outer error correction code to another of said separate groups of information, forming another set of rows of information and outer ECC information, said rows for recording on tracks of a recording media; and
   a data organizer for interleaving said one set of rows of information and outer ECC information with said another set of rows of information and outer ECC information for recording on tracks of a recording media in an interleaved pattern of said one set of rows of information and outer ECC information with said another set of rows of information and outer ECC information;
   wherein said separate groups of information comprises two said separate groups of information; and said data organizer interleaves said one set of rows of information and outer ECC information with said another set of rows of information and outer ECC information for recording on tracks of a recording media in an odd and even interleaved pattern of said one set of rows of information and outer ECC information with said another set of rows of information and outer ECC information.

2. The error correction code system of claim 1, wherein:
   said first error correction encoder and said second error correction encoder each form an equal number of rows of information and outer ECC information, respectively for said one set of rows of information and outer ECC information and for said another set of rows of information and outer ECC information; and
   said data organizer interleaves said one set of rows of information and outer ECC information with said another set of rows of information and outer ECC information for recording an equal number of said tracks of a recording media in said odd and said even interleaved pattern of said one set of rows of information and outer ECC information and said another set of rows of information and outer ECC information.

3. A magnetic tape drive, comprising:
   a tape drive system for moving a magnetic tape longitudinally;
   a recording system for recording supplied information to a magnetic tape, said magnetic tape recording system having at least one magnetic tape recording head for recording a plurality of parallel tracks of said information with respect to said magnetic tape as said magnetic tape is moved longitudinally by said tape drive system;
   a data handling system for supplying information for recording by said recording system, comprising:
   a data separator for arranging said supplied information into separate groups;
   an error correction encoder for applying an outer error correction code to one of said separate groups of information, forming one set of rows of information and outer ECC information;
   an error correction encoder for applying an outer error correction code to another of said separate groups of information, forming another set of rows of information and outer ECC information; and
   a data organizer for interleaving said one set of rows of information and outer ECC information with said another set of rows of information and outer ECC information, and supplying said rows of information and outer ECC information to said recording system for recording on said parallel tracks of a magnetic tape by said recording system in an interleaved pattern of said one set or rows of information and outer ECC information with said another set of rows of information and outer ECC information;
   wherein said data separator arranges said information into two said separate groups; and said data organizer interleaves said one set of rows of information and outer ECC information with said another set of rows of information and outer ECC information for recording on said parallel tracks of a magnetic tape in an odd and even interleaved pattern of said one set of rows of information and outer ECC information with said another set of rows of information and outer ECC information.

4. The magnetic tape drive of claim 3, wherein:
   said first error correction encoder and said second error correction encoder each form an equal number or rows of information and outer ECC information, respectively for said one set of rows of information and outer ECC information and for said another set of rows of information and outer ECC information; and
   said data organizer interleaves said one set of rows of information and outer ECC information with said another set of rows of information and outer ECC information for recording an equal number of said parallel tracks of a magnetic tape in said odd and said even interleaved pattern of said one set of rows of information and outer ECC information and said another set of rows of information and outer ECC information.

5. A data storage tape, comprising:
   a longitudinal recording medium; and
   a plurality of parallel tracks of recorded information, comprising an interleaved pattern of one set of rows of information and outer ECC information, and at least another set of rows of information and outer ECC information, said rows of information and outer ECC information comprising information from separate groups of information and separate applied outer error correction codes; said one set of rows of information and outer ECC information formed from one of said separate groups of information and an applied outer error correction code, and said at least another set of rows of information and outer ECC information formed from at least another of said separate groups of information and an applied outer error correction code;

wherein said plurality of parallel tracks of recorded information comprises two separate groups of information interleaved in an odd and even interleaved pattern of said one set of rows of information and outer ECC information with said another set of rows of information and outer ECC information.

6. The data storage tape of claim 5, wherein said plurality of parallel tracks of recorded information comprises an equal number of said parallel tracks of recorded information in said odd and said even interleaved pattern of said one set of rows on information and outer ECC information and said another set of rows of information and outer ECC information.

* * * * *